United States Patent [19]
Ajika et al.

[11] Patent Number: 5,994,732
[45] Date of Patent: *Nov. 30, 1999

[54] NONVOLATILE SEMICONDUCTOR MEMORY DEVICE

[75] Inventors: Natsuo Ajika, Hyogo; Akinori Matsuo, Tokyo, both of Japan

[73] Assignees: Mitsubishi Denki Kabushiki Kaisha; Hitachi, Ltd.; Hitachi Ulsi Engineering Corp., all of Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/852,817

[22] Filed: May 7, 1997

[30] Foreign Application Priority Data

May 10, 1996 [JP] Japan ................................ 8-116480

[51] Int. Cl.$^6$ ................................................. H01L 29/788
[52] U.S. Cl. ........................... 257/315; 257/316; 257/320; 257/323; 365/185
[58] Field of Search ..................................... 257/315, 316, 257/320, 321, 323; 365/185

[56] References Cited

U.S. PATENT DOCUMENTS 4,878,199  10/1989  Mizutani .................................. 365/185
5,554,867   9/1996  Ajika et al. ............................. 257/314

FOREIGN PATENT DOCUMENTS 3-24762    2/1991   Japan .
3-290960  12/1991   Japan .
4-352362  12/1992   Japan .
7-161845   6/1995   Japan .

OTHER PUBLICATIONS

"A Novel Cell Structure Suitable For A 3 Volt Operation, Sector Erase Flash Memory", H. Onoda et al., IEDM 92 pp. 599–602.

"Improved Array Architectures . . . ", Hiroshi Onoda et al. IEICE Trans. Electron., vol. E77–C No. 8 Aug. 1994, pp. 1279–1286.

*Primary Examiner*—Valencia Martin-Wallace
*Attorney, Agent, or Firm*—McDermott, Will & Emery

[57] ABSTRACT

A nonvolatile semiconductor memory device has a plurality of p well regions in a memory cell array region. P well region is independently provided for each erase block. Each p well region is connected to a common well/source line driver, respectively. Well/source line driver is connected to a well/source power supply and a well/block decoder. Therefore, a nonvolatile semiconductor memory device which can inhibit a well disturbance in erase operation can be provided.

6 Claims, 8 Drawing Sheets

⟨PROGRAM OPERATION⟩

FIG.7B PRIOR ART

⟨ERASE OPERATION⟩

NONVOLATILE SEMICONDUCTOR MEMORY DEVICE

BACKGROUND OF THE INVENTION

1. Field of the Invention

The present invention relates to a nonvolatile semiconductor memory device and more particularly to an electrically programmable and erasable nonvolatile semiconductor memory device (hereinafter referred to as a "flash memory") including stacked gate type memory cells (memory transistors).

2. Description of the Background Art

Figure 5:
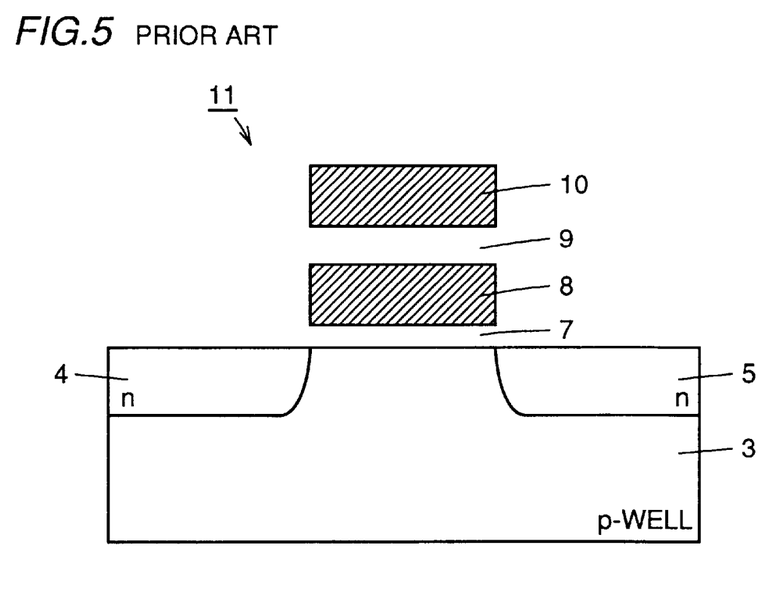
FIG. 5 is a cross sectional view showing one memory transistor in a conventional flash memory.

The electrically programmable and erasable flash memory is traditionally well known. This flash memory has a large number of memory transistors for storing data. FIG. 5 shows a cross sectional structure of a general stacked gate type memory transistor 11 formed within a conventional flash memory.

Referring to FIG. 5, drain and source regions 4 and 5 are formed spaced apart at a surface of a p well region 3. The drain and source regions 4 and 5 in this case include an n type impurity of high concentration. On a surface of p well region 3 between drain and source regions 4 and 5, an insulating film (tunnel insulating film) 7 including an extremely thin oxide film, for example, is formed to a thickness of approximately 100 Å. A floating gate 8 is formed on this tunnel insulating film 7, and a control gate (word line) 10 is formed on this floating gate 8 with an interlayer insulating film 9 therebetween. Thus, memory transistor 11 has a double gate structure. The above-described p well region 3 may be replaced by a p type semiconductor substrate.

Memory transistor 11 having the above structure is kept in an erased state or a programmed state. Here, general definitions of erasing and programming of a flash memory will be described. Erasing collectively changes threshold voltages of a plurality of memory transistors 11 to one prescribed state, while programming changes a threshold voltage of a selected memory transistor 11 to another prescribed state. Specifically, the above erasing or programming is performed depending on whether electrons are accumulated in floating gate 8 shown in FIG. 5 or emitted from floating gate 8.

Among flash memories having memory transistors 11 as described above, the one called a DINOR (DIvided bit-line NOR) type flash memory is disclosed in *IEICE TRANS. ELECTRON., VOL. E77-C, NO.8 AUGUST 1994, PP.1279~1286.*

The above-described DINOR type flash memory is in the erased state when electrons are accumulated in floating gate 8 and it is in the programmed state when electrons are drawn out of floating gate 8.

Figure 6:
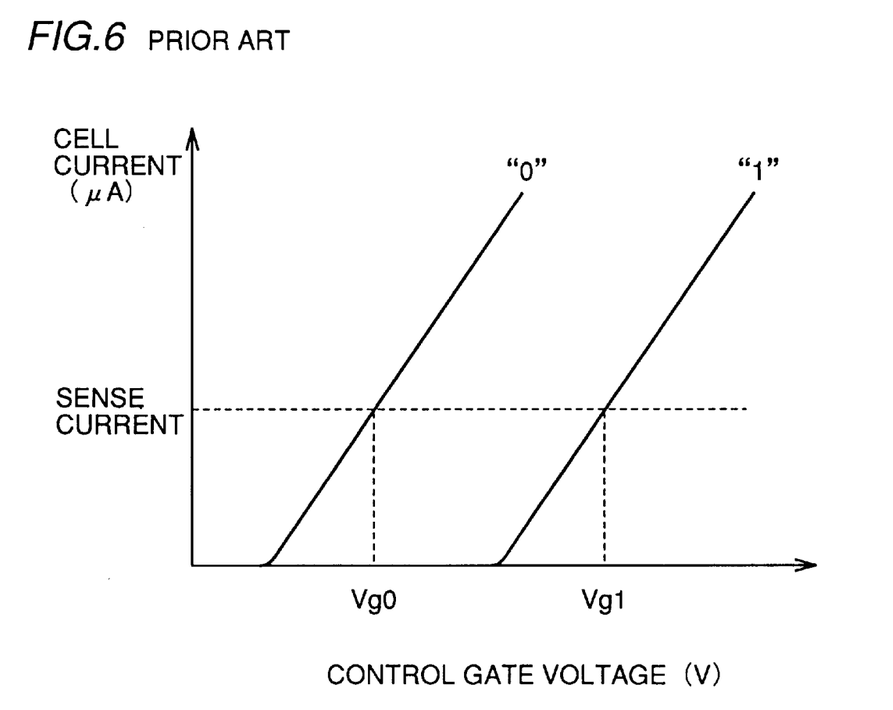
FIG. 6 is a graph showing the erased state and the programmed state of the conventional DINOR type flash memory.

FIG. 6 shows the erased and programmed states of memory transistor 11 in the DINOR type flash memory. Referring to FIG. 6, in the erased state in which electrons are injected into floating gate 8, threshold voltage of memory transistor 11 becomes relatively high. Therefore, current (sense current) of not less than a given value will not flow between drain 4 and source 5 if control gate voltage does not exceed Vg1 as shown in FIG. 6. This is because positive voltage is canceled by a negative charge of electrons accumulated in floating gate 8. Such an erased state corresponds to "1" in FIG. 6. Since electrons accumulated in floating gate 8 do not disappear almost permanently if left as they are, data stored in the gate will also be retained almost forever.

On the other hand, in the programmed state in which electrons are emitted from floating gate 8, the threshold voltage of memory transistor 11 becomes relatively low. This state corresponds to "0" in FIG. 6. Current (sense current) of not less than the given value will flow between drain 4 and source 5 because the control gate voltage exceeds Vg0.

By sensing the two states above (erased or programmed states), it is possible to read data stored in memory transistor 11.

Next, program and erase operations of the above DINOR type flash memory will be described in more detail with respect to FIGS. 7A and 7B.

Figure 7A:
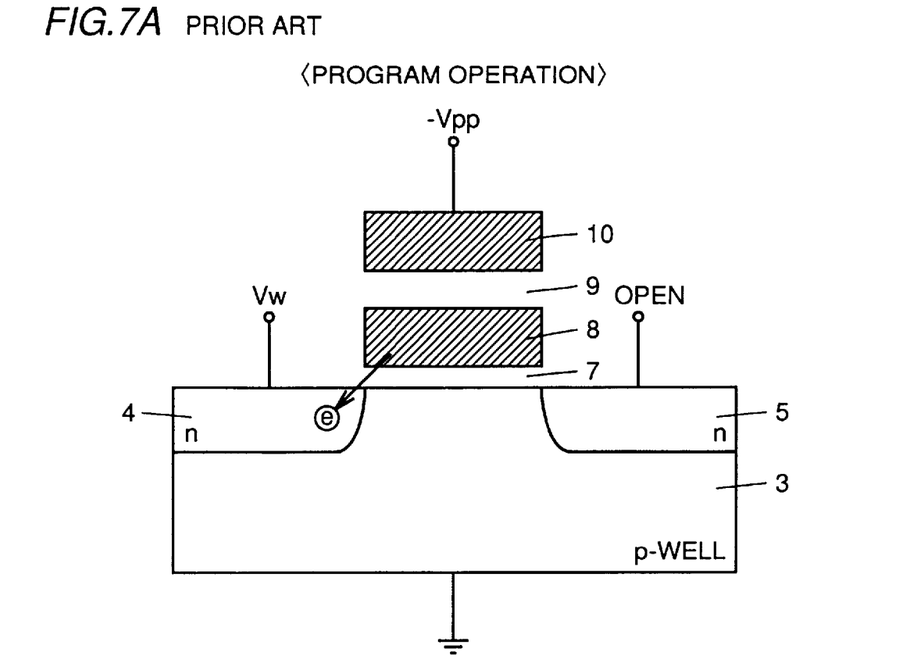
FIG. 7A is a schematic view showing the program operation of the conventional DINOR type flash memory.

Referring first to FIG. 7A, in the program operation, drain 4 is supplied with a write voltage (positive high voltage) Vw (approximately 6 V in general), control gate 10 is supplied with a negative high voltage −Vpp (approximately −10 v), and source 5 is kept open. Therefore, electrons are drawn out of floating gate 8 into drain 4 through an overlapped region of drain 4 and floating gate 8 because of the FN tunnel phenomenon. As a result, the threshold voltage of memory transistor 11 is lowered.

Figure 7B:
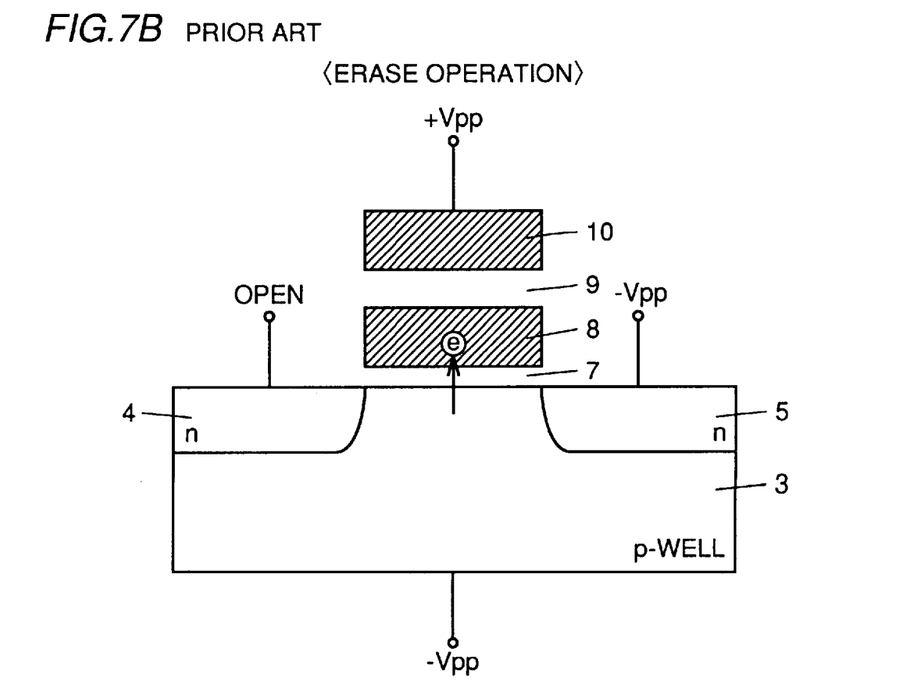
FIG. 7B is a schematic view showing the erase operation of the conventional DINOR type flash memory.

In the erase operation, as shown in FIG. 7B, drain 4 is kept in a floating state, source 5 and p well region 3 are supplied with the negative high voltage −Vpp, and control gate 10 is supplied with a positive high voltage +Vpp. Therefore, a high electric field is applied to a tunnel insulating film 7, and electrons are injected into floating gate 8 from p well region 3 (semiconductor substrate) due to the tunnel phenomenon. As a result, the threshold voltage of memory transistor 11 is raised.

By supplying the above-described voltages to memory transistor 11, memory transistor 11 is shifted to the erased or programmed state and data is programmed or erased. However, the erase operation of the DINOR type flash memory is accompanied by such problems as described below. The problems will be described with respect to FIGS. 8 and 9.

Figure 8:
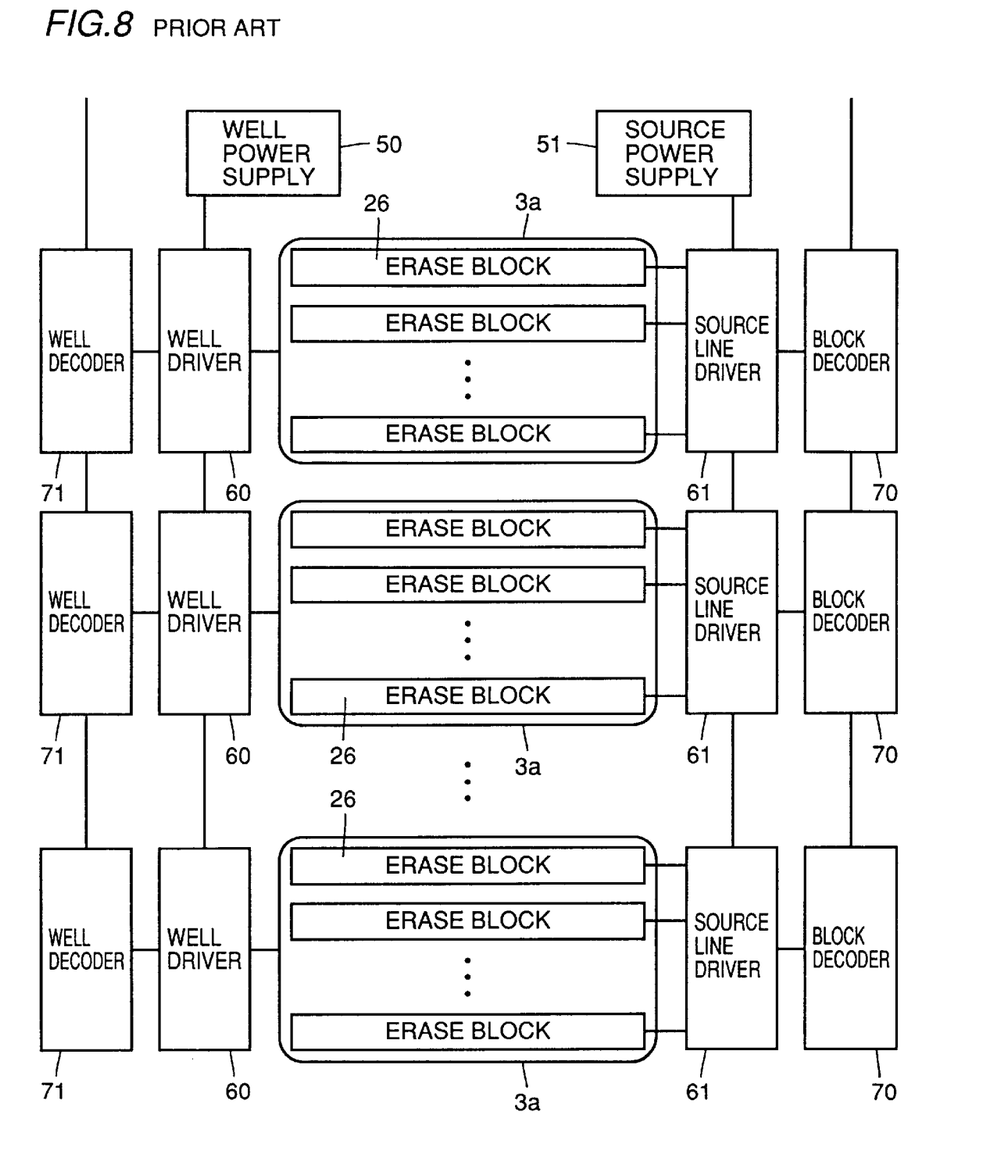
FIG. 8 is a block diagram showing circuits related to the erased state of the conventional DINOR type flash memory.

FIG. 8 is a block diagram showing circuits related to the erase operation of a conventional DINOR type flash memory. On a main surface of a semiconductor substrate, a plurality of p well regions 3a are formed, each of which is connected to a well driver 60, a well decoder 71, and a well power supply 50. Well driver 60 supplies a prescribed voltage to p well region 3a, well decoder 71 selects a prescribed p well region 3a, and well power supply 50 generates a prescribed voltage which is supplied to p well region 3a.

A plurality of erase blocks 26 are arranged within a p well region 3a. A plurality of memory transistors 11 constitute these erase blocks 26 for each of which collective erasing is performed. A source line (not shown) connected to sources 5 of memory transistors 11 in each erase block 26 is formed, and it is connected to a source line driver 61. Source line driver 61 supplies a prescribed voltage to the source line and it is connected to a block decoder 70 and a source power supply 51. Block decoder 70 is provided corresponding to each p well region 3a and it selects a prescribed erase block 26 in each p well region 3a. Source power supply 51 generates a prescribed voltage which is applied to the source line.

As described above, a plurality of erase blocks 26 are arranged in a p well region 3a in the conventional flash memory, causing problems in the erase operation. The problems will be described with respect to FIG. 9, which is an illustration showing the erase operation of the conventional flash memory.

Figure 9:
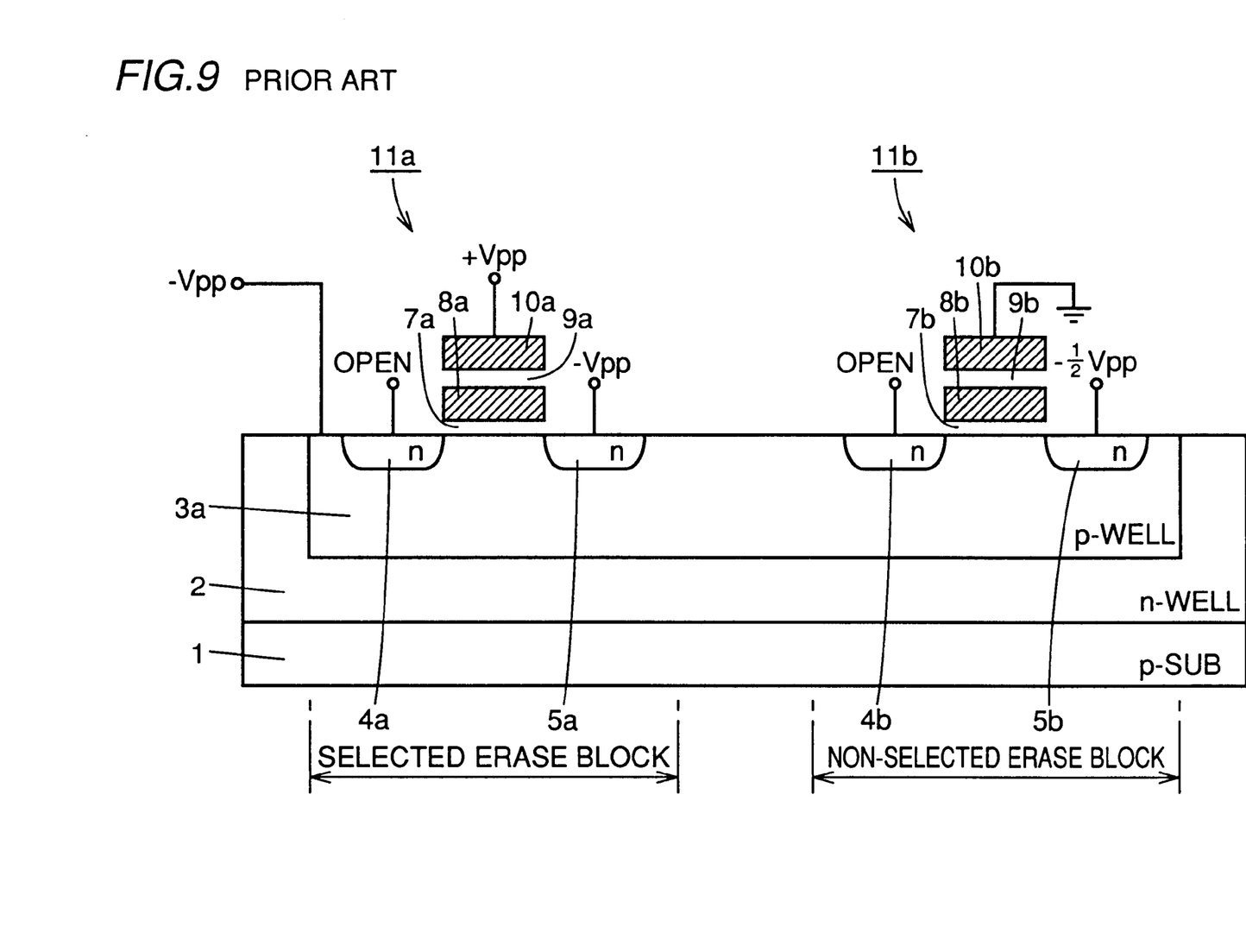
FIG. 9 is a schematic view showing the erase operation of the conventional flash memory.

Since the erase operation is conducted one by one of the erase blocks 26, during erasing, erase block 26 which is selected (selected erase block) coexists with erase block 26 which is not selected (non-selected erase block) on the same p well region 3a as shown in FIG. 9.

During erasing, −Vpp is supplied to p well region 3a. Simultaneously, a control gate 10a of a memory transistor 11a within the selected erase block is supplied with +Vpp, its drain 4a is set to an open state, and its source 5a is supplied with −Vpp. Meanwhile, a control gate of a memory transistor 11b within the non-selected erase block is grounded, its drain 4b is set to the open state, and its source 5b is supplied with −½Vpp as an erase inhibiting voltage.

Since memory transistor 11b in the non-selected erase block and memory transistor 11a in the selected erase block are formed on the same p well region 3a, the emission of electrons from floating gate 8b can not be inhibited perfectly even if the erase inhibiting voltage −½Vpp is supplied to source 5b of memory transistor 11b in the non-selected erase block. In other words, a small amount of electrons is drawn out of floating gate 8b.

Therefore, some erase blocks 26 may be falsely erased when a large number of erase blocks are arranged within the same p well region 3a or when data is rewritten many times. Such phenomenon is referred to as a well disturbance in this specification. This well disturbance becomes more serious as flash memories come to have larger storage capacity.

SUMMARY OF THE INVENTION

The present invention is directed for solving the above problems and its object is to provide a nonvolatile semiconductor memory device which can prevent the generation of the well disturbance in the erase operation.

The nonvolatile semiconductor memory device in accordance with the present invention has a plurality of memory transistors formed on a memory cell array region at a main surface of a semiconductor substrate and each including a floating gate, a source and a drain, its erase operation is performed when electrons are injected into the floating gate from the semiconductor substrate and its program operation is performed when electrons are drawn out of the floating gate to the semiconductor substrate. The nonvolatile semiconductor memory device in accordance with the invention includes first and second well regions, first and second erase blocks, and a common voltage supplying circuit. The first and second well regions are formed spaced apart in the memory cell array region. The first erase block includes a first memory transistor group formed on the first well region. The second erase block includes a second memory transistor group formed on the second well region. The voltage supplying circuit is connected to the first and second well regions, and connected to sources of the first and second memory transistor groups with a switching circuit therebetween, in order to supply a prescribed voltage to the first and second well regions and to sources of the first and second memory transistor groups.

As described above, the nonvolatile semiconductor memory device in accordance with the invention has an independent well formed for each erase block, each well being connected to the common voltage supplying circuit. Therefore, in the erase operation, different voltages can be supplied to a well arranged in a selected erase block and to a well arranged in a non-selected erase block, respectively. It can effectively prevent the occurrence of the well disturbance in a memory transistor of the non-selected erase block when the erase operation is performed.

Preferably, the voltage supplying circuit includes a common well/source driver connected to the first and second well regions and to sources of the first and second memory transistor groups, a well/block decoder connected to this well/source driver for selecting the first or second well region and the first or second erase block, and a common well/source power supply connected to the well/source driver.

Since the voltage supplying circuit is structured as above, its circuit structure can be made simpler than the prior art. The reasons will be described below. Since the independent well is formed for each erase block as described above, there is no need to supply the erase inhibiting voltage (−½Vpp) to a source of a memory transistor in a non-selected erase block. That makes it possible to replace, for example, a source power supply 51 shown in FIG. 8 with a well power supply 50. As a result, source power supply 51 can be omitted. Since one erase block is arranged for each well region, a well decoder 71, for example, shown in FIG. 8 can be replaced by a block decoder 70. That makes it possible to omit well decoder 71 shown in FIG. 8. Also, well driver 71 shown in FIG. 8 can be replaced by a source line driver 61. Thus, source line driver 61 shown in FIG. 8 can be omitted. As above, the nonvolatile semiconductor memory device can be simplified in its circuit structure as compared with the prior art and it can also be controlled easily because it does not require the erase inhibiting voltage.

Preferably, a third well region is formed in the memory cell array region, and a redundancy block having the same structure as the first or second erase block for repairing a defect, if any, is formed on the third well region.

Since the redundancy block has the same structure as the erase block as described above, the well disturbance can be effectively inhibited in the redundancy block. As a result, the erase block can be replaced by the redundancy block without the well disturbance.

Preferably, first and second select gate transistors are respectively formed on the first and second well regions, first and second sub bit lines are respectively formed on the first and second memory transistor groups with an insulating layer therebetween, connected to drains of a plurality of memory transistors in the first and second memory transistor groups, and a main bit line is formed on the first and second sub bit lines with an insulating layer therebetween. The main bit line is connected to the first sub bit line via the first select gate transistor and to the second sub bit line via the second select gate transistor.

Since the first and second select gate transistors are respectively formed as described above, the first and second select gate transistors can control connection/disconnection of the main bit line to/from the first and second sub bit lines. That effectively inhibits a drain disturbance in each erase block when the erase operation is performed.

It is also preferred that an isolating region is formed surrounding the first and second well regions to isolate between the first and second well regions as well as to isolate the first and second well regions from other regions. On the first and second memory transistor groups, respective first and second source lines are preferably formed with an insulating layer therebetween, electrically connected to sources of the first and second memory transistor groups. On the isolating region, an auxiliary source line for lowering resistance of the first or second source line is preferably formed, connected to the first or second source line.

Since the isolating region is formed surrounding the first and second well regions as described above, the auxiliary source line can be formed on this isolating region. This auxiliary source line is connected to the first or second source line. Provision of such auxiliary source line can lower the source line resistance.

It is also preferred that a plurality of memory transistors in the first memory transistor group share a first word line formed on floating gates of this plurality of memory transistors with the insulating layer therebetween and that the first erase block is arranged along the entire length of the first word line to include all memory transistors sharing the first word line. It is also preferred that a plurality of memory transistors in the second memory transistor group share a second word line formed on floating gates of this plurality of memory transistors with the insulating layers therebetween and that the second erase block is arranged along the entire length of the second word line to include all memory transistors sharing the second word line.

Since the first or second erase block is arranged along the entire length of the first or second word line as described above, all memory transistors sharing the first or second word line can be included in the first or second erase block. Therefore, it can be effectively inhibited to cause the disturbance in other erase blocks by the first or second word line when the erase operation is performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
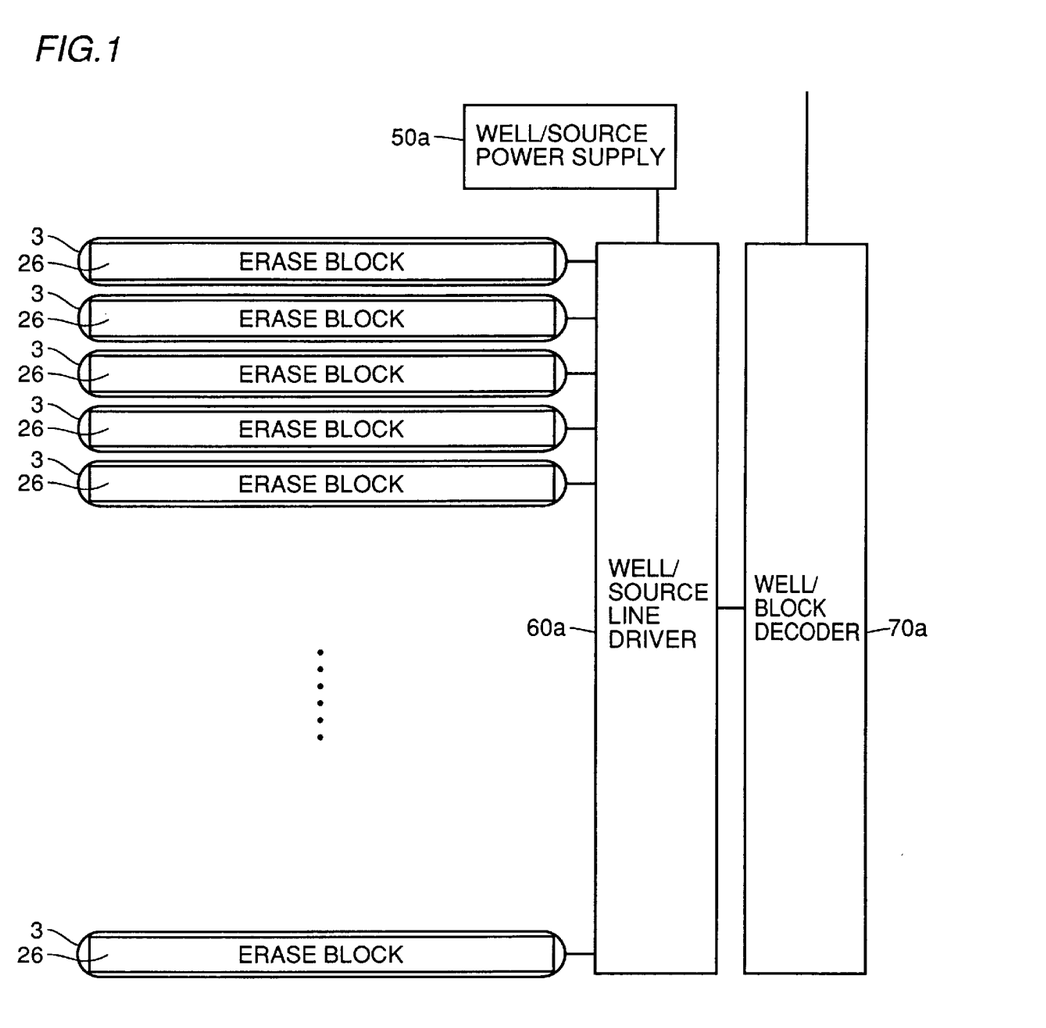
FIG. 1 is a block diagram showing circuits related to the erase operation of a DINOR type flash memory in accordance with one embodiment of the present invention.

The embodiment of the present invention will be described below with respect to FIGS. 1 to 4. FIG. 1 is a block diagram showing circuits related to the erase operation of a DINOR type flash memory in one embodiment of the present invention.

Referring to FIG. 1, a plurality of p well regions 3 are formed spaced apart in a memory cell array region of a flash memory. One erase block 26 is arranged in each p well region 3. P well regions 3 are electrically isolated one another. Since each erase block 26 is arranged in p well region 3 which is isolated from other p well regions 3 as described above, a well disturbance in the erase operation can be effectively inhibited.

Each p well region 3 is connected to a well/source line driver 60a. Also, a source line connected to sources of a plurality of memory transistors arranged in each erase block 26 is connected to well/source line driver 60a via a switching element. Therefore, well/source line driver 60a functions as a source line driver shown in FIG. 8 as well. Thus, it is possible to omit a source line driver 61 or a well driver 60 shown in FIG. 8.

Well/source line driver 60a is connected to a well/source power supply 50a and a well/block decoder 70a. Well/source power supply 50a functions as a well power supply and a source power supply as well, to generate a prescribed voltage to be supplied to p well region 3 or the source line. Well/block decoder 70a selects each erase block 26 or each p well region 3.

As described above, the present invention can simplify a circuit structure as compared with a conventional embodiment shown in FIG. 8.

In the structure shown in FIG. 1, one of a plurality of erase blocks 26 can be used, as it is, as a redundancy block for repairing a defect, if any. In other words, each erase block 26 and the redundancy block can have the equivalent structure. Thus, replacement of each erase block 26 with the redundancy block becomes possible provided that characteristics of the disturbance and the like are same.

Figure 2:
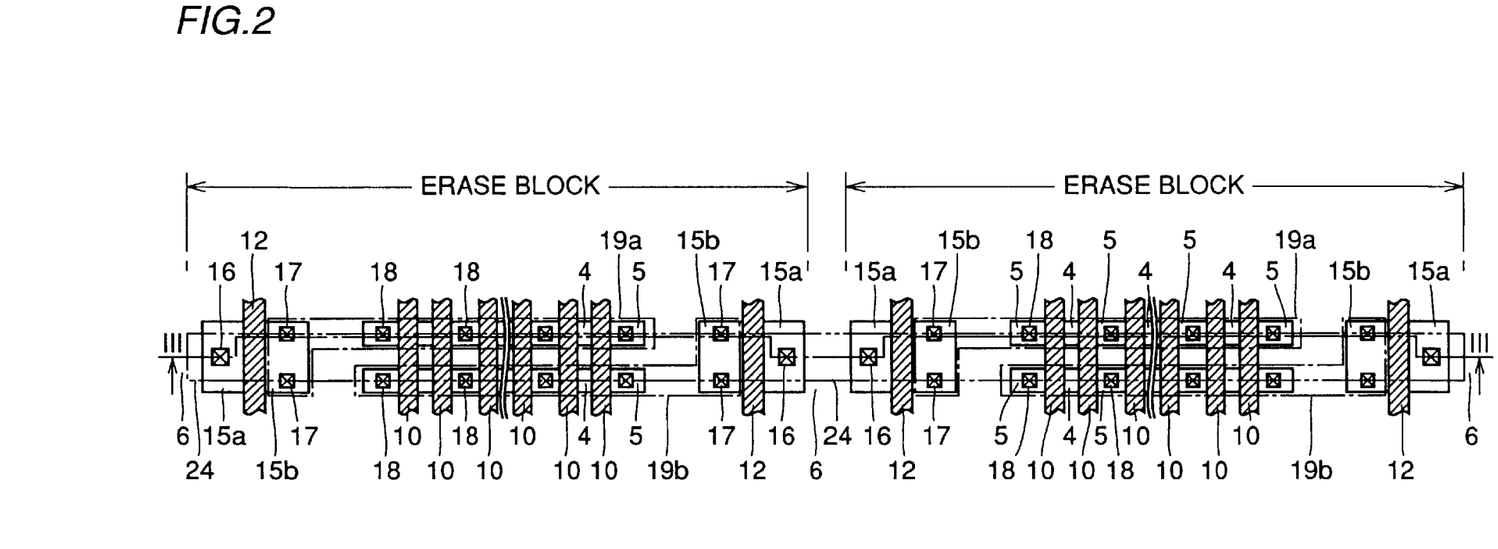
FIG. 2 is a partial plan view of the DINOR type flash memory in accordance with the embodiment of the present invention.
Figure 3:
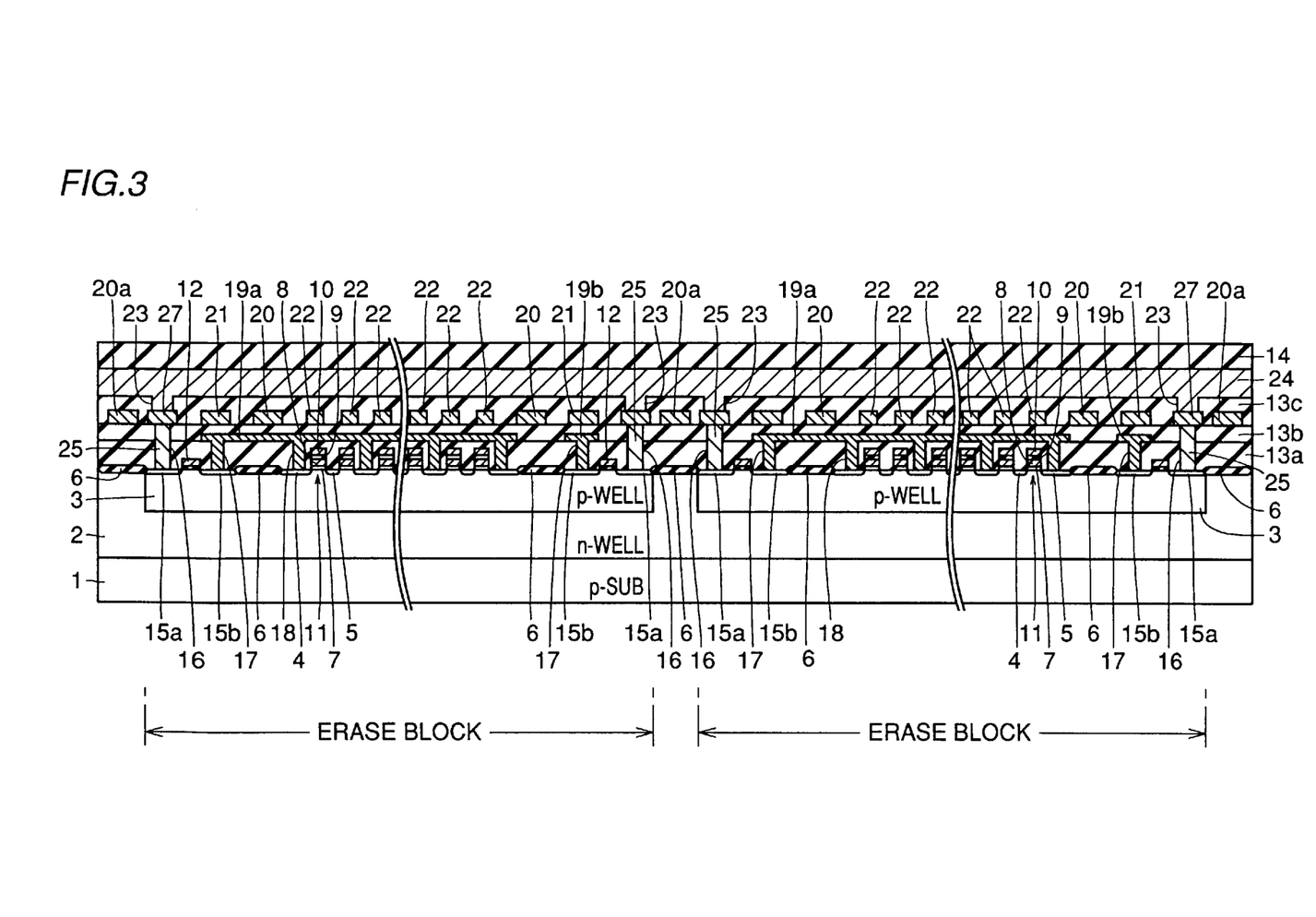
FIG. 3 is a cross sectional view taken along a line III—III of FIG. 2.

Here, a specific structure of a flash memory in accordance with the present invention will be described in detail with respect to FIGS. 2 and 3. FIG. 2 is a partial plan view of a flash memory in one embodiment of the present invention. FIG. 3 is a cross sectional view taken along a line III—III of FIG. 2.

Referring to FIGS. 2 and 3, an n well region 2 is formed at a main surface of a p type semiconductor substrate 1. This n well region 2 is formed in a memory cell array region of the flash memory. P well regions 3 are formed spaced apart at a surface of n well region 2. An insulating oxide film 6 is formed around the p well region 3. This insulating oxide film 6 insulates each p well region 3. A trench for insulation may be formed instead of this insulating oxide film. That enables reduction in insulating width. Although above described p well region 3 may be formed by normal thermal diffusion, it may be formed by implanting an impurity with high energy of 200 keV or more. This method can allow insulation between p well regions 3 with narrower space than the thermal diffusion.

Select gate transistors are formed on a surface of p well region 3. The select gate transistor includes a select gate 12 and n type impurity regions 15a, 15b. In this case, the select gate transistors are provided at both ends of p well region 3. Between these two select gate transistors, a pair of insulating oxide films 6 are formed, between which a plurality of memory transistors 11 are formed.

A plurality of memory transistors 11 are arranged in one erase block and they form a memory transistor group. This memory transistor group constitutes one erase block. On memory transistors 11, sub bit lines 19a, 19b are formed with an interlayer insulating layer 13a therebetween. These sub bit lines 19a, 19b are connected to a drain 4 of each memory transistor 11 via a contact hole 18. Sub bit lines 19a, 19b are also connected to one n type impurity region 15b of the select gate transistor via a contact hole 17.

An interlayer insulating layer 13b is formed to cover sub bit lines 19a, 19b. On this interlayer insulating layer 13b, interconnection layers 21, 22, 27, source lines 20 and auxiliary source lines 20a are formed, including metal such as Al. Interconnection layer 21 is connected to select gate 12, source line 20 is connected to a source 5 of memory transistor 11, and interconnection layer 22 is connected to a control gate (word line) 10 of memory transistor 11. Auxiliary source line 20a is formed over insulating oxide film 6 and connected to prescribed source line 20. This auxiliary source line 20a enables reduction in resistance of source line 20.

An interlayer insulating layer 13c is formed to cover above described interconnection layers 21, 22, 27, source lines 20, and auxiliary source lines 20a. A main bit line 24 is formed on this interlayer insulating layer 13c. This main bit line 24 includes metal such as Al. Main bit line 24 is connected to the other n type impurity region 15a of the select gate transistor via a contact hole 23, interconnection layer 27, and a contact hole 16. Contact hole 16 is provided penetrating interlayer insulating layers 13a, 13b, and it has a plug electrode 25 inside. Contact hole 23 is provided to penetrate interlayer insulating layer 13c and reach interconnection layer 27. An insulating layer 14 is formed to cover main bit line 24.

Figure 4:
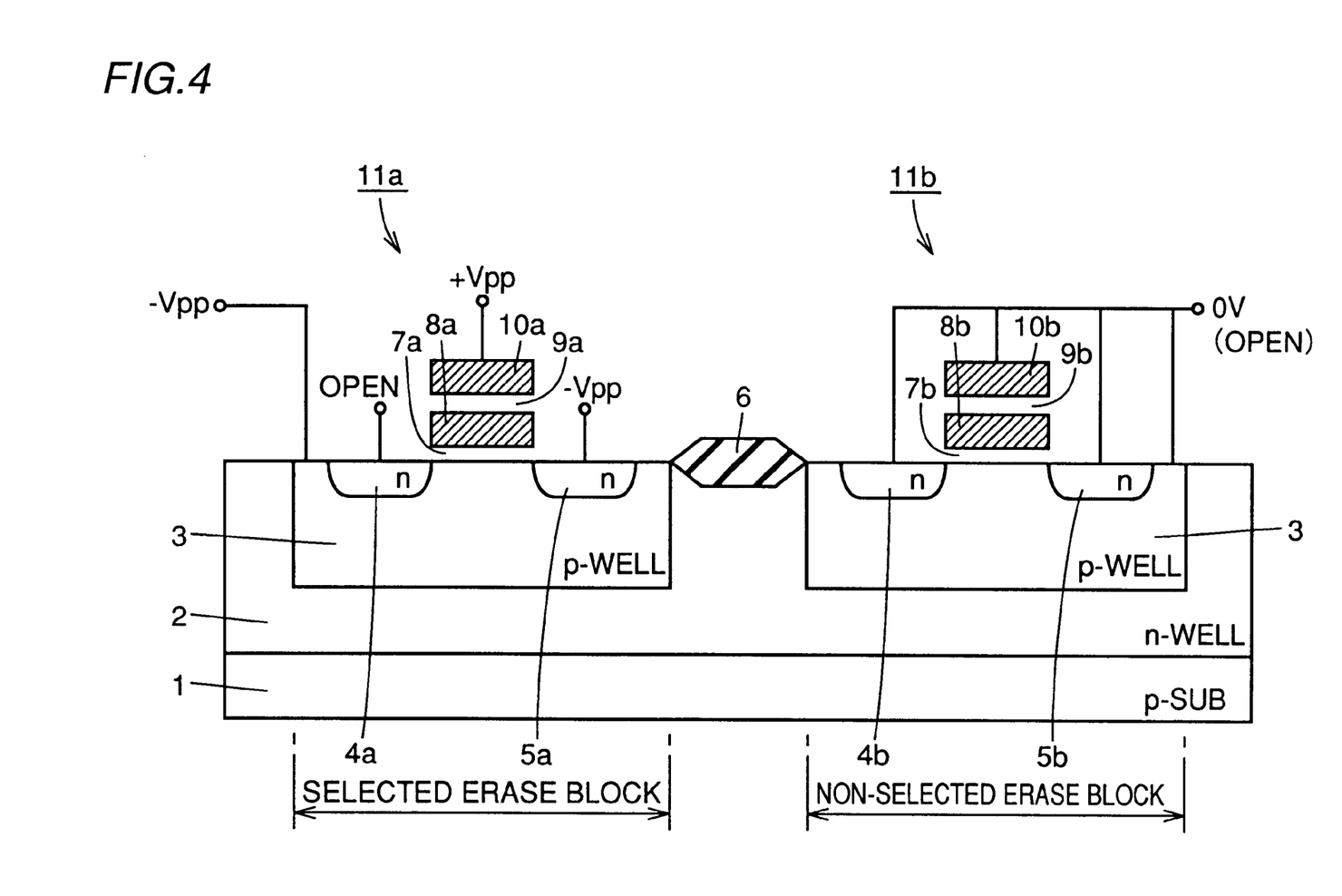
FIG. 4 is a schematic view showing the erase operation of the DINOR type flash memory in accordance with the present invention.

Here, the erase operation of the flash memory in accordance with the present invention, having the above described structure, will be described with respect to FIG. 4. FIG. 4 is a schematic view showing the erase operation of the flash memory in accordance with the present invention.

Referring to FIG. 4, a control gate 10b, a source 5b, and a drain 4b in a memory transistor 11b within a non-selected erase block as well as p well region 3 at which memory transistor 11b is formed are being supplied with 0 V, respectively, when a memory transistor 11a within a selected erase block is erased. Thus, p well region 3 in which the non-selected erase block is arranged has a potential fixed to 0 V. Therefore, it is possible to inhibit a well disturbance in the non-selected erase block in the erase operation of the flash memory. Control gate 10b, source 5b, and drain 4b of memory transistor 11b within the non-selected erase block and p well regions 3 at which memory transistor 11b is formed may be in an open state.

Characteristic portions of the flash memory in accordance with the present invention will be further described with respect to FIG. 3 again. Beside being able to inhibit the well disturbance as described above, the flash memory in accordance with the present invention can inhibit a drain disturbance and a disturbance by a word line in the non-selected erase block when the erase operation is performed.

First, the drain disturbance will be described. As shown in FIG. 3, main bit line 24 is connected to sub bit lines 19a and 19b via the select gate transistor. Therefore, the select gate transistor controls connection/disconnection of main bit line 24 to/from sub bit lines 19a, 19b. Thus, this select gate transistor can electrically insulate the non-selected erase block from main bit line 24. That inhibits the drain disturbance in the non-selected erase block when the erase operation is performed.

Also, as shown in FIG. 2, control gate (word line) 10 extends crossing main bit line 24. In other words, word line extends parallel to a longitudinal direction of erase block 26. Here, erase block 26 is preferably arranged along the entire length of the word line. That is, erase block 26 is preferably defined to include all of a plurality of memory transistors sharing one word line in one erase block 26. In that case, the disturbance by the word line in the non-selected erase block can be effectively inhibited in the erase operation.

As described above, according to the present invention, each erase block can be almost perfectly isolated electrically in the erase operation of the flash memory. Thus, a flash memory of high reliability is obtained.

Further, according to the present invention, an independent well is formed for each erase block, so that the well disturbance in the erase operation can be inhibited in a non-selected erase block. Therefore, erroneous operation (erroneous erase) due to the erase operation can be effectively inhibited, and a nonvolatile semiconductor memory device of high reliability is obtained. Also, by forming a well for each erase block as described above, it is possible to simplify a circuit structure related to the erase operation to a greater extent than a conventional example. That reduces the area occupied by circuits related to the erase operation. Further, by providing a select gate transistor and extending the erase block along the entire length of a word line, it is possible to effectively inhibit the drain disturbance in the non-selected erase block and a disturbance by the word line when the erase operation is performed. Further, formation of a well for each erase block can allow the equivalent structure of the erase block and a redundancy block. Therefore, the erase block can be replaced by the redundancy block provided that characteristics such as the disturbance are almost same. When an isolating region is formed, isolating between well regions in which each erase block is formed, an auxiliary source line can be formed over the isolating region. It enables reduction in resistance of the source line and improvement in performance of the nonvolatile semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device having a plurality of memory transistors each of which includes a floating gate, a source, and a drain and is formed on a memory cell array region at a main surface of a semiconductor substrate, wherein an erase operation is performed by injecting electrons into said floating gate from said semiconductor substrate and a program operation is performed by drawing electrons out of said floating gate to said semiconductor substrate, comprising:

first and second well regions formed spaced apart in said memory cell array region;

a first erase block comprising a first memory transistor group formed on said first well region;

a second erase block comprising a second memory transistor group formed on said second well region; and common voltage supplying means connected to said first and second well regions and to sources of said first and second memory transistor groups with switching means therebetween for supplying a prescribed voltage to said first and second well regions in a first switch activation and to sources of said first and second memory transistor groups in a second switch activation.

2. The nonvolatile semiconductor memory device according to claim 1, wherein said voltage supplying means includes a common well/source driver connected to said first and second well regions and to sources of said first and second memory transistor groups, a common well/block decoder connected to said well/source driver for selecting said first or second well region and said first or second erase block, and a common well/source power supply connected to said well/source driver.

3. the nonvolatile semiconductor memory device according to claim 1, further comprising a third well region formed in said memory cell array region, and a redundancy block, comprising a third memory transistor group formed on said third well region said redundancy block available for replacing a defective one of said first and second erase blocks.

4. A nonvolatile semiconductor memory device having a plurality of memory transistors each of which includes a floating gate, a source, and a drain and is formed on a memory cell array region at a main surface of a semiconductor substrate, wherein an erase operation is performed by injecting electrons into said floating gate from said semiconductor substrate and a program operation is performed by drawing electrons out of said floating sate to said semiconductor substrate, comprising:

first and second well regions formed spaced apart in said memory cell array region;

a first erase block comprising a first memory transistor group formed on said first well region;

a second erase block comprising a second memory transistor group formed on said second well region; and common voltage supplying means connected to said first and second well regions and to sources of said first and second memory transistor groups with switching means therebetween for supplying a prescribed voltage to said first and second well regions and to sources of said first and second memory transistor groups;

wherein first and second select gate transistors are formed on said first and second well regions;

on said first and second memory transistor groups, first and second sub bit lines are formed with an insulating layer therebetween, connected to drains of said plurality of memory transistors in said first and second memory transistor groups, and a main bit line is formed on said first and second sub bit lines with an insulating layer therebetween, and said main bit line is connected to said first sub bit line via said first select gate transistor and to said second sub bit line via said second select gate transistor.

5. A nonvolatile semiconductor memory device having a plurality of memory transistors each of which includes a floating gate, a source, and a drain and is formed on a memory cell array region at a main surface of a semiconductor substrate, wherein an erase operation is performed by injecting electrons into said floating gate from said semiconductor substrate and a program operation is performed by drawing electrons out of said floating gate to said semiconductor substrate, comprising:

first and second well regions formed spaced apart in said memory cell array region;

a first erase block comprising a first memory transistor group formed on said first well region;

a second erase block comprising a second memory transistor group formed on said second well region; and common voltage supplying means connected to said first and second well regions and to sources of said first and second memory transistor groups with switching means therebetween for supplying a prescribed voltage to said first and second well regions and to sources of said first and second memory transistor groups;

wherein an isolating region for isolating between said first and second well regions and isolating said first and second well regions from other regions is formed surrounding said first and second well regions;

on said first and second memory transistor groups, first and second source lines are respectively formed with an insulating layer therebetween, electrically connected to sources of said first and second memory transistor groups; and an auxiliary source line is connected to said first or second source line for lowering resistance of said first r second source line is formed on said isolating region.

6. A nonvolatile semiconductor memory device having a plurality of memory transistors each of which includes a floating gate, a source, and a drain and is formed on a memory cell array region at a main surface of a semiconductor substrate, wherein an erase operation is performed by injecting electrons into said floating gate from said semiconductor substrate and a program operation is performed by drawing electrons out of said floating gate to said semiconductor substrate, comprising:

first and second well regions formed spaced apart in said memory cell array region:

a first erase block comprising a first memory transistor group formed on said first well region;

a second erase block comprising a second memory transistor group formed on said second well region; and common voltage supplying means connected to said first and second well regions and to sources of said first and second memory transistor groups with switching means therebetween for supplying a prescribed voltage to said first and second well regions and to sources of said first and second memory transistor groups;

wherein said plurality of memory transistors in said first memory transistor group share a first word line formed on said floating gate of said plurality of memory transistors with an insulating layer therebetween;

said first erase block is arranged along the entire length of said word line to include all of said memory transistors sharing said first word line;

said plurality of memory transistors in said second memory transistor group share a second word line formed on said floating gate of said plurality of memory transistors with the insulating layer therebetween; and said second erase block is arranged along the entire length of said second word line to include all of said memory transistors sharing said second word line.

* * * * *

UNITED STATES PATENT AND TRADEMARK OFFICE
CERTIFICATE OF CORRECTION

PATENT NO. : 5,994,732
DATED : November 30, 1999
INVENTOR(S) : Natsuo Ajika, et al.

It is certified that error appears in the above-identified patent and that said Letters Patent is hereby corrected as shown below:

Column 10, line 18, after "line" insert --,--.

Column 10, line 18, delete "is".

Column 10, line 19, "r" should read --or--.

Column 10, line 20, after "line" insert --,--.

Signed and Sealed this

Thirteenth Day of June, 2000

Attest:

Q. TODD DICKINSON

*Attesting Officer*       *Director of Patents and Trademarks*